US012566217B2

(12) United States Patent
Jeon et al.

(10) Patent No.: US 12,566,217 B2
(45) Date of Patent: Mar. 3, 2026

(54) APPARATUS AND METHOD FOR ESTIMATING BATTERY CELL CAPACITY

(71) Applicant: LG ENERGY SOLUTION, LTD., Seoul (KR)

(72) Inventors: Jihoon Jeon, Daejeon (KR); Taesoo Kim, Daejeon (KR); Kyoung Min Bae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 383 days.

(21) Appl. No.: 18/038,938

(22) PCT Filed: Jul. 11, 2022

(86) PCT No.: PCT/KR2022/010048
§ 371 (c)(1),
(2) Date: May 25, 2023

(87) PCT Pub. No.: WO2023/038262
PCT Pub. Date: Mar. 16, 2023

(65) Prior Publication Data
US 2024/0094306 A1      Mar. 21, 2024

(30) Foreign Application Priority Data
Sep. 9, 2021     (KR) ........................ 10-2021-0120059

(51) Int. Cl.
*G01R 31/396*          (2019.01)
*G01R 31/36*           (2020.01)
(Continued)

(52) U.S. Cl.
CPC ....... *G01R 31/396* (2019.01); *G01R 31/3648* (2013.01); *G01R 31/388* (2019.01); *H02J 7/0048* (2020.01); *H02J 7/00712* (2020.01)

(58) Field of Classification Search
CPC .............. G01R 31/396; G01R 31/3648; G01R 31/388; G01R 31/392; H02J 7/0048; H02J 7/00712
See application file for complete search history.

(56) References Cited

U.S. PATENT DOCUMENTS

| | | | |
|---|---|---|---|
| 8,374,807 B2 * | 2/2013 | Hall .................. | G01R 31/3842 702/63 |
| 2003/0008202 A1 * | 1/2003 | Tran ..................... | H01M 10/48 429/61 |

(Continued)

FOREIGN PATENT DOCUMENTS

| | | |
|---|---|---|
| CN | 103399278 A | 11/2013 |
| CN | 109164398 A | 1/2019 |

(Continued)

OTHER PUBLICATIONS

Extended European Search Report issued May 23, 2024 for European Patent Application No. 22867531.0.

(Continued)

*Primary Examiner* — Ricky Go
(74) *Attorney, Agent, or Firm* — Morgan, Lewis & Bockius LLP

(57)     ABSTRACT

A method for estimating battery cell capacity may comprise deriving a discharge curve for each battery cell included in a module including a plurality of battery cells; deriving a charge curve for each battery cell included in the module; calculating an additional dischargeable capacity of a second battery cell based on a pattern of the discharge curve of a first battery cell; calculating an additional chargeable capacity of the second battery cell based on the transition of the charge curve of the first battery cell; and calculating a capacity of the second battery cell based on the additional (Continued)

dischargeable capacity and the additional chargeable capacity of the second battery cell.

14 Claims, 7 Drawing Sheets

(51) Int. Cl.
_G01R 31/388_ (2019.01)
_H02J 7/00_ (2006.01)

(56) References Cited

U.S. PATENT DOCUMENTS

| | | | |
|---|---|---|---|
| 2006/0049805 A1 | 3/2006 | Tran | |
| 2013/0110428 A1* | 5/2013 | Sun ................... | G01R 31/3842 |
| | | | 702/63 |
| 2013/0314050 A1 | 11/2013 | Matsubara et al. | |
| 2014/0172333 A1 | 6/2014 | Gopalakrishnan et al. | |
| 2015/0276885 A1 | 10/2015 | K.R. et al. | |
| 2016/0061908 A1* | 3/2016 | Torai .................. | G01R 31/3648 |
| | | | 702/63 |
| 2016/0187428 A1 | 6/2016 | Basu et al. | |
| 2017/0038436 A1 | 2/2017 | Montaru | |
| 2022/0146585 A1 | 5/2022 | Hong et al. | |
| 2022/0187384 A1* | 6/2022 | Bae ..................... | G01R 31/3648 |
| 2022/0276314 A1 | 9/2022 | Kim et al. | |
| 2022/0368150 A1* | 11/2022 | Sharma ............. | H02J 7/007184 |

FOREIGN PATENT DOCUMENTS

| | | | |
|---|---|---|---|
| CN | 110320477 | A | 10/2019 |
| CN | 111781529 | A | 10/2020 |
| CN | 112816893 | A | 5/2021 |
| EP | 3276364 | A1 | 1/2018 |
| EP | 3667345 | A1 | 6/2020 |
| EP | 3671243 | A1 | 6/2020 |
| JP | H10-154533 | A | 6/1998 |
| JP | 2001-289925 | A | 10/2001 |
| JP | 2013-247003 | A | 12/2013 |
| JP | 5493407 | B2 | 5/2014 |
| JP | 2017-220293 | A | 12/2017 |
| JP | 2019-148492 | A | 9/2019 |
| JP | 6649814 | B2 | 2/2020 |
| KR | 10-2016-0079637 | A | 7/2016 |
| KR | 10-2016-0144437 | A | 12/2016 |
| KR | 10-2021-0031172 | A | 3/2021 |
| KR | 10-2021-0031226 | A | 3/2021 |
| KR | 10-2021-0067227 | A | 6/2021 |

OTHER PUBLICATIONS

Office Action dated Feb. 13, 2025 issued in corresponding Korean Patent Application No. 10-2021-0120059.
International Search Report (with translation) and Written Opinion dated Nov. 7, 2022, issued in corresponding International Patent Application No. PCT/KR2022/010048.
Office Action dated Sep. 17, 2025 issued in corresponding Chinese Patent Application No. 202280007767.X. (Note: EP 3276364 A1 cited in this CN Office Action has already been cited in a prior IDS.).

* cited by examiner

APPARATUS AND METHOD FOR ESTIMATING BATTERY CELL CAPACITY

This application is a U.S. National Stage of PCT International Application No. PCT/KR2022/010048, filed on Jul. 11, 2022, which claims priority to and the benefit of Korean Patent Application No. 10-2021-0120059, filed in the Korean Intellectual Property Office on Sep. 9, 2021, the entire contents of which are incorporated herein by reference.

TECHNICAL FIELD

The present invention relates to an apparatus and method for estimating battery cell capacity, and more particularly, to an apparatus and method for more accurately calculating the capacity of each of a plurality of battery cells included in a module.

BACKGROUND ART

As a demand for various portable electronic devices increases and a development of batteries for electric vehicles and energy storage systems is in full swing, a research on high-performance batteries capable of repeatedly charging and discharging is being actively conducted. In particular, batteries used in an electric vehicle or an energy storage system may be configured as a battery module by connecting a plurality of battery cells to charge or discharge high-output and large-capacity power.

A battery control technology can be very important in a device or a system that uses a battery as an energy source. As one of control technologies, controlling charging and discharging of the battery based on a remaining battery capacity may be used to increase operation efficiency of a device or a system.

Meanwhile, in a battery module composed of several battery cells connected in series, the capacity of the entire module is determined by a battery cell in which a large amount of deterioration or voltage deviation occurs, and thus, battery capacities for the remaining cells may not be clearly detected.

DETAILED DESCRIPTION OF THE INVENTION

Technical Problem

To obviate one or more problems described above, an object of the present disclosure is to provide an apparatus for calculating battery cell capacity so that a deterioration state of each battery cell can be accurately diagnosed by estimating the remaining capacities of all cells in a battery module.

To obviate one or more problems described above, another object of the present disclosure is to provide a method for calculating battery cell capacity.

Technical Solution

In order to achieve an above objective of the present disclosure, an apparatus for estimating battery cell capacity according to an embodiment of the present disclosure may comprise at least one processor; and a memory for storing at least one instruction executed by the at least one processor, wherein the at least one instruction may include an instruction to derive a discharge curve for each battery cell included in a module including a plurality of battery cells; an instruction to derive a charge curve for each battery cell included in the module; an instruction to calculate an additional dischargeable capacity of a second battery cell based on a pattern of the discharge curve of a first battery cell; an instruction to calculate an additional chargeable capacity of the second battery cell based on the transition of the charge curve of the first battery cell; and an instruction to calculate a capacity of the second battery cell based on the additional dischargeable capacity and the additional chargeable capacity of the second battery cell.

In the embodiment, the plurality of battery cells may be connected in series and included in the module. The first battery cell may be a battery cell in which deterioration has progressed the most among a plurality of battery cells in the module.

The instruction to calculate an additional dischargeable capacity of a second battery cell may include an instruction to extend the discharge curve of the second battery cell to a voltage at which the first battery cell is discharged to the maximum based on a pattern of the discharge curve of the first battery cell, wherein the extended part of the discharge curve of the second battery cell is derived by shifting the discharge curve of the first battery cell on the time axis.

The instruction to calculate an additional chargeable capacity of the second battery cell may include an instruction to extend the charge curve of the second battery cell to a voltage at which the first battery cell is charged to the maximum based on a pattern of the charge curve of the first battery cell, wherein the extended part of the charge curve of the first battery cell is derived by shifting the charge curve of the first battery cell on the time axis.

The capacity of the second battery cell may be calculated based on the discharge capacity of the module, the additional dischargeable capacity of the second battery cell, the additional chargeable capacity of the second battery cell, and a charge-discharge efficiency.

The second battery cell may be any one of the remaining cells except for the first battery cell among all the battery cells in the module.

According to another embodiment of the present disclosure to achieve another objective of the present disclosure, a method for estimating battery cell capacity may comprise deriving a discharge curve for each battery cell included in a module including a plurality of battery cells; deriving a charge curve for each battery cell included in the module; calculating an additional dischargeable capacity of a second battery cell based on a pattern of the discharge curve of a first battery cell; calculating an additional chargeable capacity of the second battery cell based on the transition of the charge curve of the first battery cell; and calculating a capacity of the second battery cell based on the additional dischargeable capacity and the additional chargeable capacity of the second battery cell.

In the embodiment, the plurality of battery cells may be connected in series and included in the module. The first battery cell may be a battery cell in which deterioration has progressed the most among a plurality of battery cells in the module.

The calculating an additional dischargeable capacity of a second battery cell may include extending the discharge curve of the second battery cell to a voltage at which the first battery cell is discharged to the maximum based on a pattern of the discharge curve of the first battery cell, wherein the extended part of the discharge curve of the second battery cell is derived by shifting the discharge curve of the first battery cell on the time axis.

The calculating an additional chargeable capacity of the second battery cell may include extending the charge curve of the second battery cell to a voltage at which the first battery cell is charged to the maximum based on a pattern of the charge curve of the first battery cell, wherein the extended part of the charge curve of the first battery cell is derived by shifting the charge curve of the first battery cell on the time axis.

The calculating the capacity of the second battery cell may include calculating the capacity of the second battery cell based on the discharge capacity of the module, the additional dischargeable capacity of the second battery cell, the additional chargeable capacity of the second battery cell, and a charge-discharge efficiency.

The capacity of the second battery cell may be calculated based on the discharge capacity of the module, the additional dischargeable capacity of the second battery cell, the additional chargeable capacity of the second battery cell, and a charge-discharge efficiency.

The second battery cell may be any one of the remaining cells except for the first battery cell among all the battery cells in the module.

Advantageous Effects

According to the embodiments of the present invention, it is possible to estimate the remaining capacities of all cells in a battery module in which a plurality of battery cells are connected in series.

Accordingly, it is possible to accurately check the deterioration state of each battery cell included in a battery module.

BRIEF DESCRIPTION OF THE DRAWINGS

FIG. 4 illustrates a concept of deriving an additionally chargeable capacity of each battery cell from a behavior graph of the lowest charge capacity cell according to an embodiment of the present invention.

FIG. 6 is a block diagram of an apparatus for estimating battery cell capacity according to embodiments of the present invention.

BEST MODES FOR PRACTICING THE DISCLOSURE

Figure 1:
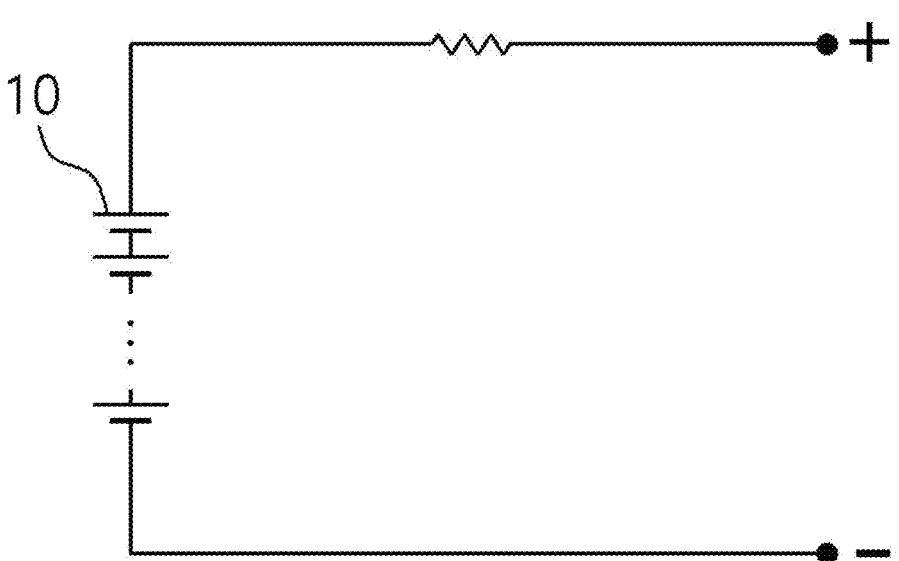
FIG. 1 is a block diagram of a typical battery module.

The present invention may be modified in various forms and have various embodiments, and specific embodiments thereof are shown by way of example in the drawings and will be described in detail below. It should be understood, however, that there is no intent to limit the present invention to the specific embodiments, but on the contrary, the present invention is to cover all modifications, equivalents, and alternatives falling within the spirit and technical scope of the present invention. Like reference numerals refer to like elements throughout the description of the figures.

It will be understood that, although the terms such as first, second, A, B, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes combinations of a plurality of associated listed items or any of the plurality of associated listed items.

It will be understood that when an element is referred to as being "coupled" or "connected" to another element, it can be directly coupled or connected to the other element or an intervening element may be present. In contrast, when an element is referred to as being "directly coupled" or "directly connected" to another element, there is no intervening element present.

The terms used herein is for the purpose of describing specific embodiments only and are not intended to limit the present invention. As used herein, the singular forms "a", "an" and "the" are intended to include the plural forms as well, unless the context clearly indicates otherwise. It will be further understood that the terms "comprises", "comprising", "includes", "including" and/or "having", when used herein, specify the presence of stated features, integers, steps, operations, constitutional elements, components and/or combinations thereof, but do not preclude the presence or addition of one or more other features, integers, steps, operations, constitutional elements, components, and/or combinations thereof.

Unless otherwise defined, all terms used herein, including technical and scientific terms, have the same meanings as commonly understood by one skilled in the art to which the present invention belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Hereinafter, embodiments of the present disclosure are described in detail with reference to the accompanying drawings.

FIG. 1 is a block diagram of a typical battery module.

A battery module 10 may typically include a plurality of battery cells connected in series with each other. In FIG. 1, N battery cells are connected in series, thereby constituting a battery module. A battery cell is a minimum unit of a battery that serves to store energy. Depending on a device, a system or an environment to which the battery is applied, a series/parallel combination of battery cells may constitute a battery module, and a plurality of battery modules may constitute a battery rack or a battery pack.

Here, a battery pack may include not only a plurality of battery cells connected in series, but also various components for charging and discharging the battery pack, such as a bus bar, a cable, a relay, and a control circuit.

Meanwhile, even for battery cells disposed and used in a same pack, degradation degrees of cells therein may be different over time, and accordingly, voltage deviations of the battery cells may appear different from one another. When a load is applied to a weak cell, energy may be consumed faster compared to a strong cell. In addition, during a process of charging, a weak cell with a smaller charge capacity reaches a full charge state first before a strong cell does, causing a problem that the weak cell remains in an overcharged state for a long time. Furthermore, during a process of discharging, weak cells are discharged first and may be affected by stronger cells.

Figure 2:
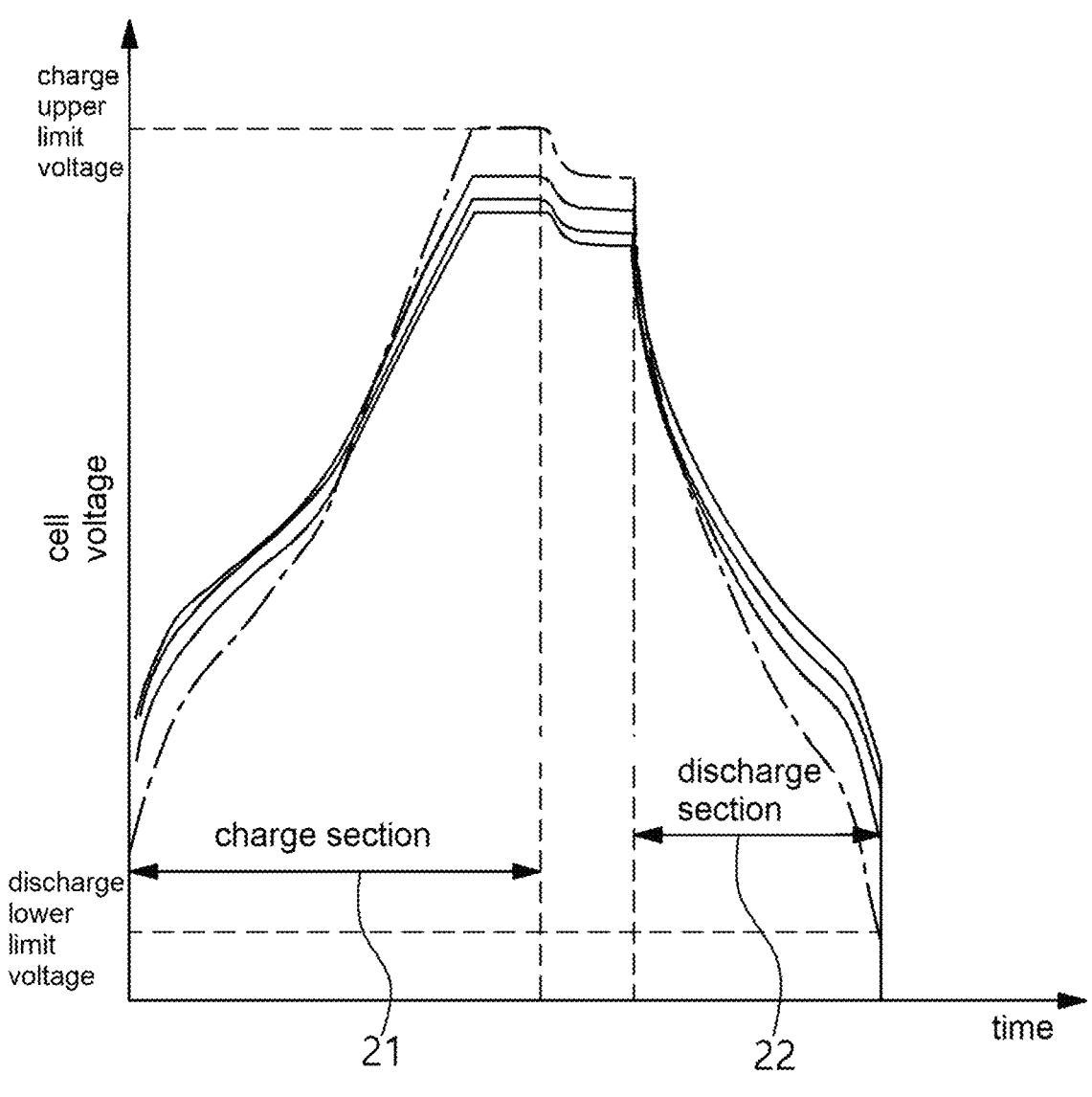
FIG. 2 is a graph illustrating voltage changes during charging/discharging operations of a plurality of battery cells connected in series.

FIG. 2 is a graph illustrating voltage changes during charging/discharging operations of a plurality of battery cells connected in series.

Each curve in FIG. 2 shows a change of measured voltages of each battery cell over time. For each curve, a first time section 21 represents a section in which charging occurs and a second time section 22 represents a section in which discharging occurs.

In FIG. 2, the charge upper limit voltage is a maximum voltage for safely charging the battery cell and may be preset. In addition, the discharge lower limit voltage is a minimum voltage for safely discharging the battery cell and may be preset.

Referring to FIG. 2, a dotted curve is a voltage behavior of a battery cell in which deterioration occurs the most. The the most deteriorated battery cell reaches the upper limit of charge voltage first during charging and at this moment, charging operations for all the battery cells in the module are stopped. On the other hand, during discharging, discharging of a battery cell that has undergone the most degradation proceeds the fastest, so that the voltage of the battery cell reaches the lower limit of discharge first. Here, not only the discharging operation for the most deteriorated battery cell but also the discharging operations of the other battery cells are stopped.

In other words, the capacity of the entire module is determined by the capacity of the battery cell in which deterioration has progressed the most. Thus, when a plurality of battery cells in a module are connected in series, the capacity of the module is the same as the capacity of one battery cell that has deteriorated the most among all battery cells in the module.

Here, since charging or discharging has not been performed to the charge upper limit voltage or discharge lower limit voltage for the remaining battery cells, a problem occurs that it is hard to accurately determine how much charge/discharge capacity each cell has until it reaches the charge upper limit voltage or the discharge lower limit voltage.

Figure 3:
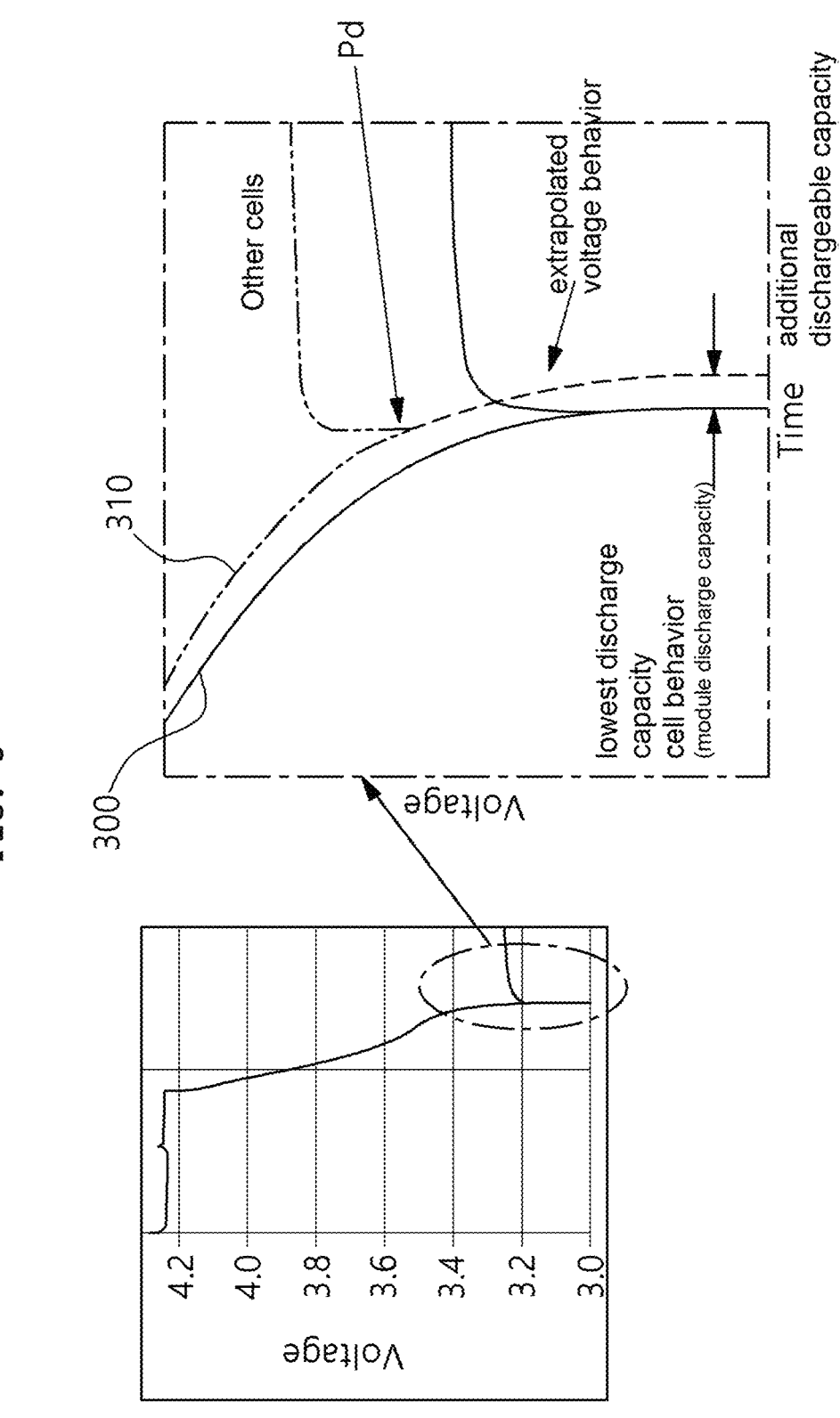
FIG. 3 illustrates a concept of deriving an additionally dischargeable capacity of each battery cell from a behavior graph of a lowest discharge capacity cell according to an embodiment of the present invention.

FIG. 3 illustrates a concept of deriving an additionally dischargeable capacity of each battery cell from a behavior graph of a lowest discharge capacity cell according to embodiments of the present invention.

The curve 300 in FIG. 3 shows a voltage behavior of the lowest discharge capacity cell, measured over time during discharging. Here, the cell with the lowest discharge capacity may be a cell which has undergone degradation the most in the module. In curve 310, the portion corresponding to the line above the point Pd shows a discharge behavior of one of the battery cells in the module except for the lowest discharge capacity cell.

Here, according to embodiments of the present invention, a virtual curve (indicated by a dotted line below Pd in FIG. 3) for a first battery cell which is one of the battery cells in the module may be generated. The virtual curve may extend from a point where discharging stops in the actual discharge line of the first battery cell, that is, point Pd in FIG. 3, in a direction in which the voltage is getting lowered. The virtual discharge curve for the first battery cell may be set to be the same as the pattern of the discharge curve 300 of the cell with the lowest discharge capacity. In other words, the virtual discharge curve for the first battery cell may extend in a direction in which the voltage of the battery cell decreases from the point Pd as time elapses, and follows a line in which the discharge curve 300 of the lowest discharge capacity cell is shifted on the time axis. In FIG. 3, a virtual discharge curve for the first battery cell indicated by a dotted line is represented as an extrapolated voltage behavior. Here, an additionally dischargable capacity of first battery cell may be a dischargable amount corresponding to an amount of time to which the virtual discharge curve for the first battery cell is shifted on the time axis from the discharge curve 300 of the lowest discharge capacity cell.

Figure 4:
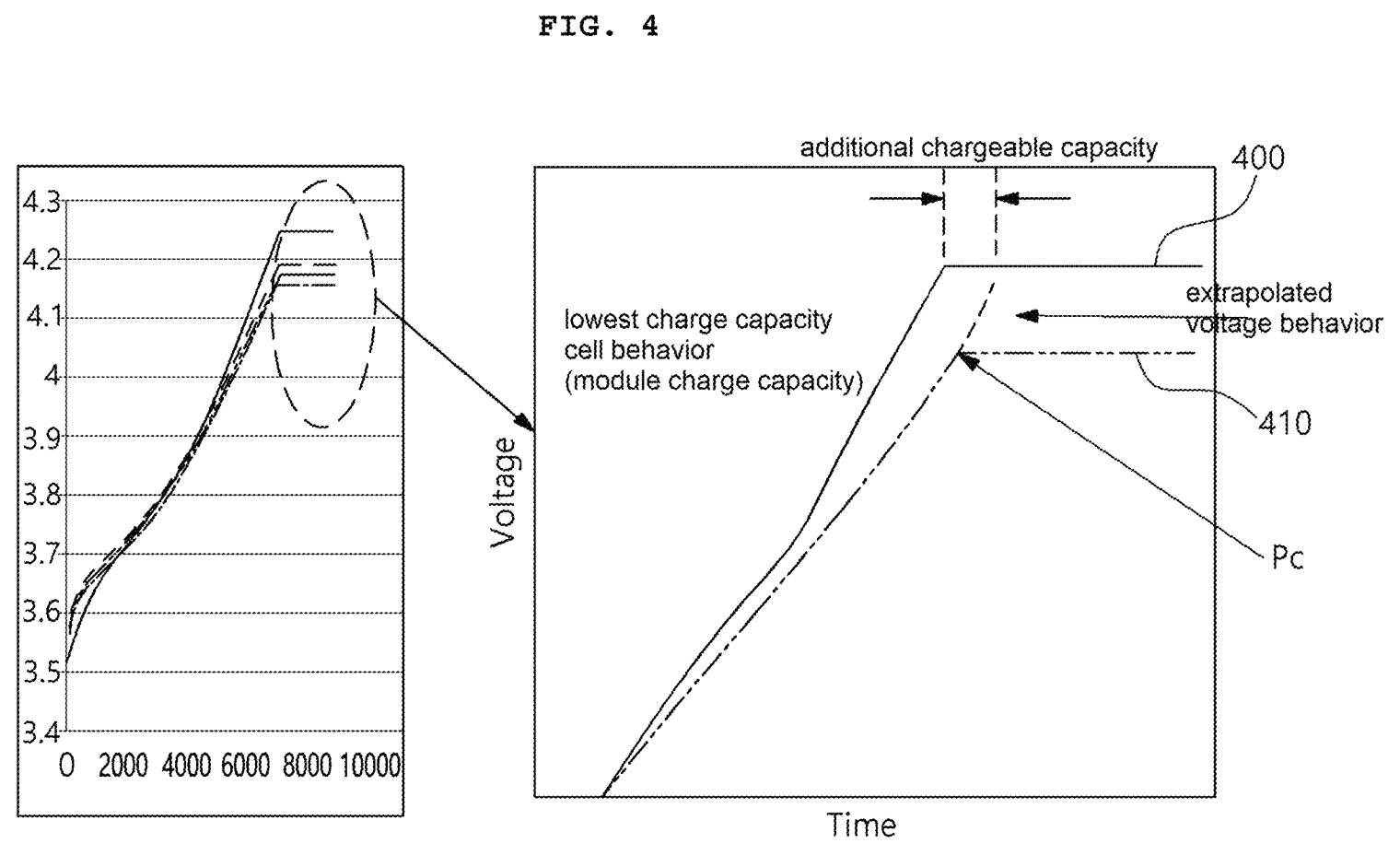

FIG. 4 illustrates a concept of deriving an additionally chargeable capacity of each battery cell from a behavior graph of the lowest charge capacity cell according to embodiments of the present invention.

The curve 400 in FIG. 4 shows the voltage behavior of the lowest charge capacity cell, measured over time during charging. Here, the lowest charge capacity cell may be a cell that has undergone the most degradation in the module. In the curve 410, a portion corresponding to a line below the point Pc indicates a charging behavior of one of the battery cells in the module except for the lowest charge capacity cell.

According to embodiments of the present invention, a virtual curve (indicated by a dotted line above Pc in FIG. 4) for a first battery cell which is one of the battery cells in the module may be generated. The virtual curve may extend from a point where charging stops in the actual charge curve of the first battery cell, that is, the point Pc in FIG. 4 in a direction in which the voltage rises. Here, the virtual charge curve for the first battery cell may be set to be the same as the pattern of the charge curve 400 of the lowest charge capacity cell. In other words, the virtual charge curve for the first battery cell may extend in a direction in which the voltage of the battery cell increases from the point Pc as time elapses and follows a curve in which the charge curve 400 of the lowest charge capacity cell is shifted on the time axis. In the embodiment of FIG. 4, a virtual charge curve for the first battery cell indicated by a dotted line is represented as an extrapolated voltage behavior. Here, an additionally chargeable capacity of first battery cell may be a chargeable amount corresponding to an amount of time to which the virtual charge curve for the first battery cell is shifted on the time axis from the curve 400 of the lowest charge capacity cell.

Then, the capacity of each battery cell may be calculated based on the additional dischargeable capacity and the additional chargeable capacity which are derived through the methods described with reference to FIGS. 3 and 4. The capacity of each cell may be defined as in Equation 1 below.

$$\text{Individual capacity of each cell in module} = \text{module discharge capacity} + \text{additional dischargeable capacity} + (\text{additional chargeable capacity} * \text{charge-discharge efficiency}) \quad \text{[Equation 1]}$$

Here, the individual capacity of each cell may indicate an amount of electricity (Ah) that can be output when it is assumed that the cell is charged to the upper limit voltage and discharged to the lower limit voltage. In addition, the charge-discharge efficiency may be defined as a value obtained by dividing a module discharge capacity by a module charge capacity.

Figure 5:
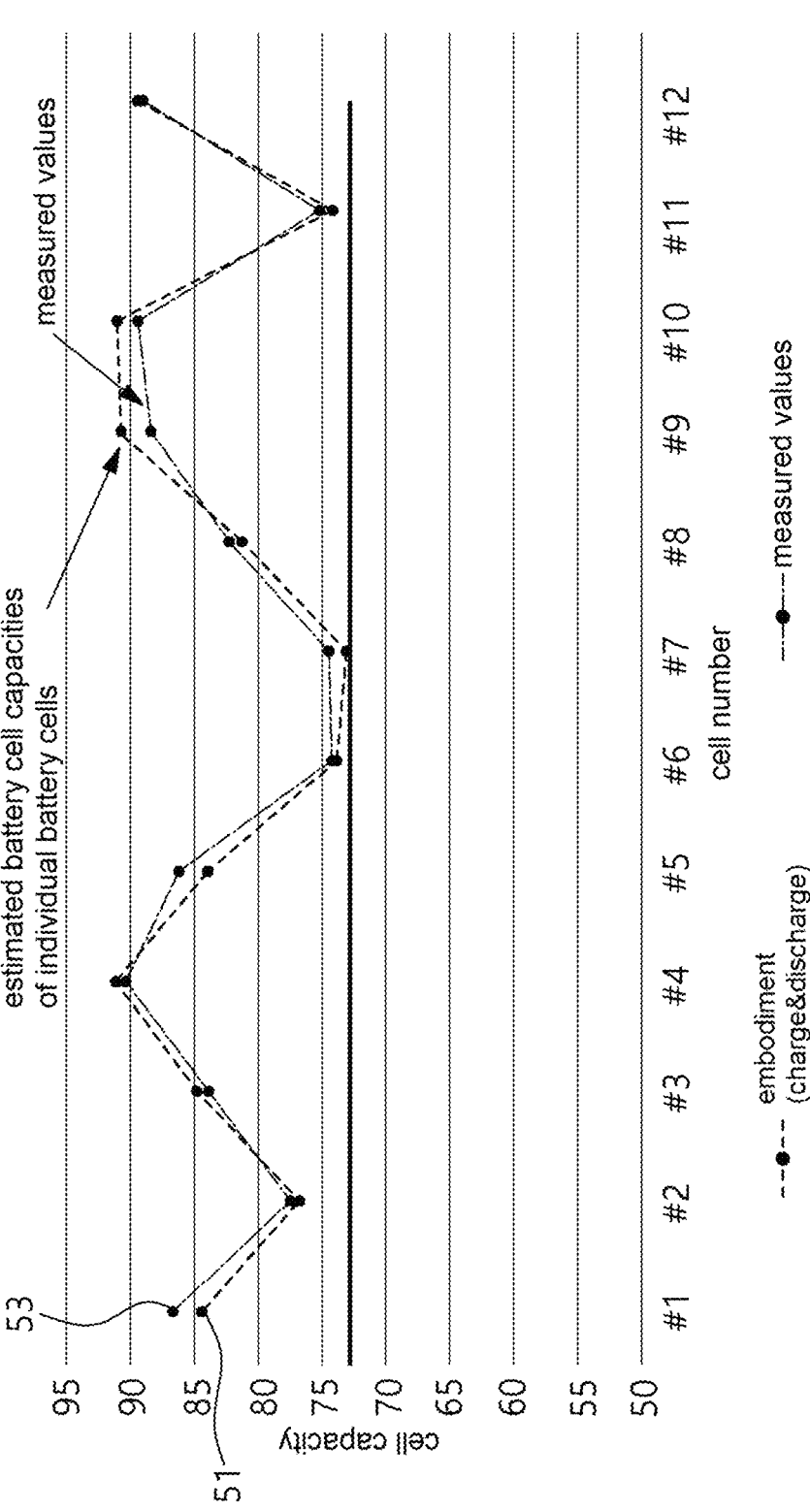
FIG. 5 is a graph illustrating a battery cell capacity estimation result according to embodiments of the present invention in comparison with an actually measured value.

FIG. 5 is a graph illustrating a battery cell capacity estimation result according to embodiments of the present invention in comparison with an actually measured value.

In FIG. 5, line 51 includes capacities of individual battery cells calculated as described in the above embodiments using the charge/discharge curve of each battery cell in a module including 12 battery cells connected in series. On the contrary, graph 53 shows values obtained by individually measuring the capacities of respective battery cells by disassembling the module.

Line 51 and line 53 show 1% of difference on average, up to 3% maximum. Thus, there is no significant difference between the actually measured capacity of the battery cell and the estimated capacity of the battery cell according to the present invention. Accordingly, an actual deterioration state of a battery cell can be accurately determined without disassembling a module and measuring each disassembled battery cell, according to a method for calculating the battery cell capacity suggested by the present invention.

Figure 6:
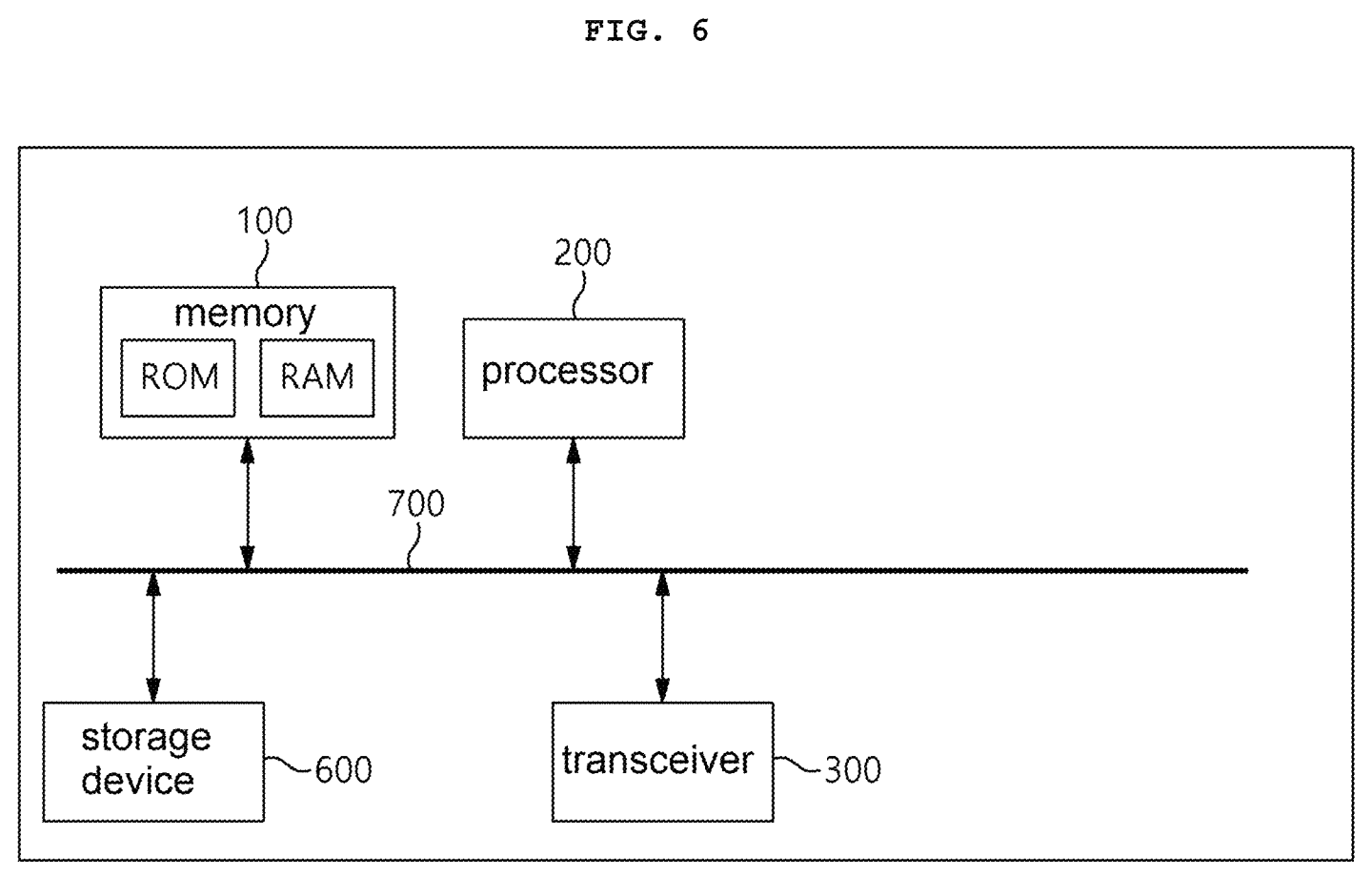

FIG. 6 is a block diagram of an apparatus for estimating battery cell capacity according to embodiments of the present invention.

Referring to FIG. 6, the apparatus for calculating a battery cell capacity may include a memory 100, at least one processor 200, a transceiver 300, and a storage device 600. Each of the components 100, 200, 300, and 600 included in the apparatus for calculating the capacity of a battery cell may be connected by a bus 700 to perform communication with each other.

The apparatus for calculating battery cell capacity according to the present invention may be implemented as a battery management system (BMS) or included in the battery management system which may be a part of a battery system or a separate device.

The memory 100 and the storage device 600 may be configured as at least one of a volatile storage medium and a non-volatile storage medium. For example, the memory 100 and the storage device 600 may include at least one of a read only memory (ROM) and a random access memory (RAM).

The memory 100 may store at least one instruction or command executed by the processor 200. The processor 200 may comprise a central processing unit (CPU), a graphics processing unit (GPU), or a dedicated processor on which methods according to embodiments of the present invention are performed.

The processor 200 may execute at least one program command or instruction stored in the memory 100.

The at least one instruction may include an instruction to derive a discharge curve for each battery cell included in a module including a plurality of battery cells; an instruction to derive a charge curve for each battery cell included in the module; an instruction to calculate an additional dischargeable capacity of a second battery cell based on a pattern of the discharge curve of a first battery cell; an instruction to calculate an additional chargeable capacity of the second battery cell based on the transition of the charge curve of the first battery cell; and an instruction to calculate a capacity of the second battery cell based on the additional dischargeable capacity and the additional chargeable capacity of the second battery cell.

Here, the plurality of battery cells may be connected in series and included in the module. The first battery cell may be a battery cell in which deterioration has progressed the most among a plurality of battery cells in the module.

The instruction to calculate an additional dischargeable capacity of a second battery cell may include an instruction to extend the discharge curve of the second battery cell to a voltage at which the first battery cell is discharged to the maximum based on a pattern of the discharge curve of the first battery cell, wherein the extended part of the discharge curve of the second battery cell is derived by shifting the discharge curve of the first battery cell on the time axis.

The instruction to calculate an additional chargeable capacity of the second battery cell may include an instruction to extend the charge curve of the second battery cell to a voltage at which the first battery cell is charged to the maximum based on a pattern of the charge curve of the first battery cell, wherein the extended part of the charge curve of the first battery cell is derived by shifting the charge curve of the first battery cell on the time axis.

The capacity of the second battery cell may be calculated based on the discharge capacity of the module, the additional dischargeable capacity of the second battery cell, the additional chargeable capacity of the second battery cell, and a charge-discharge efficiency.

The memory 100 or the storage device 600 may store information on the charge curves and the discharge curves of respective battery cells and the battery module calculated by the processor.

Figure 7:
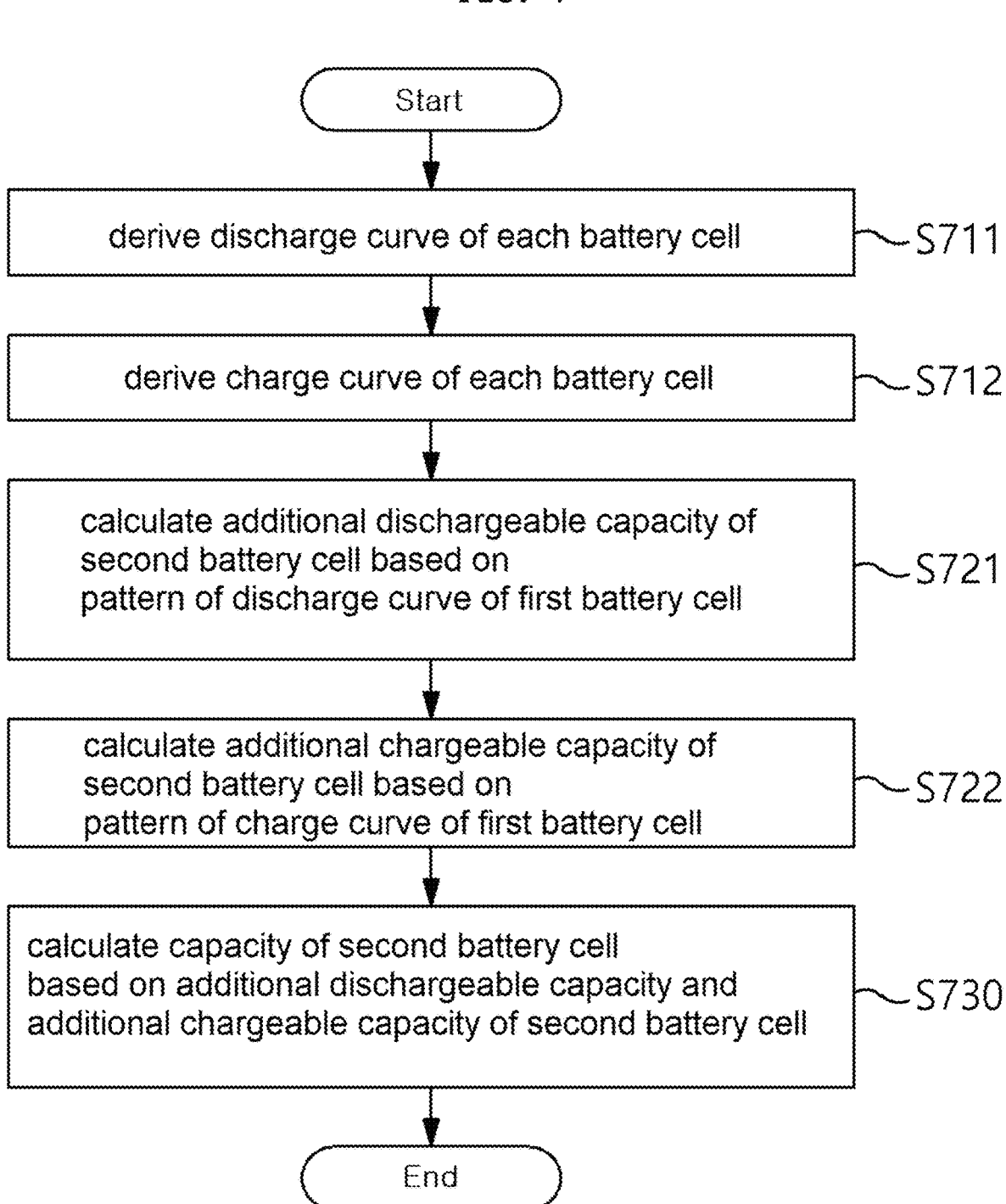
FIG. 7 is a flowchart of a method for estimating battery cell capacity according to embodiments of the present invention.

FIG. 7 is a flowchart of a method for estimating battery cell capacity according to embodiments of the present invention.

The method for calculating battery cell capacity illustrated in FIG. 7 relates to a method for calculating capacity of each battery cell in a battery module including a plurality of battery cells, and may be performed by an apparatus for calculating battery cell capacity. In some embodiments, the apparatus for calculating battery cell capacity may be a battery management system (BMS). In addition, the plurality of battery cells may be connected in series and included in the battery module.

Referring to FIG. 7, the apparatus for calculating battery cell capacity may derive a discharge curve of each battery cell included in the battery module (S711). The apparatus for calculating battery cell capacity may also derive a charge curve of each battery cell included in the battery module (S712).

Thereafter, an additional dischargeable capacity of a second battery cell may be calculated according to a transition pattern of the discharge curve of a first battery cell (S721). More specifically, the discharge curve of the second battery cell may be extended to a voltage at which the first battery cell is discharged to the maximum based on a pattern of the discharge curve of the first battery cell, wherein the extended part of the discharge curve of the second battery cell is derived by shifting the discharge curve of the first battery cell on the time axis.

Here, the first battery cell may be a battery cell in which deterioration has progressed the most among a plurality of battery cells in the module.

In addition, an additional chargeable capacity of the second battery cell may be calculated according to a transition pattern of the charge curve of the first battery cell (S722). More specifically, the charging curve of the second battery cell may be extended to a voltage at which the first battery cell is charged to the maximum based on a pattern of the charge curve of the first battery cell, wherein the extended part of the charge curve of the first battery cell is derived by shifting the charge curve of the first battery cell on the time axis.

For convenience of illustration, steps 711, 712, 721, and 722 are illustrated in order, but steps 711 and 712 may be performed simultaneously or the order may be reversed. This applies to steps 721 and 722 the same. However, step 721 should be performed after step 711 and step 722 should be performed after step 712.

Once the additional dischargeable capacity and the additional chargeable capacity of the second battery cell are calculated, the capacity of the second battery cell may be calculated based on the calculated additional dischargeable capacity and additional chargeable capacity of the second battery cell (S730). More specifically, the capacity of the second battery cell may be calculated based on the discharge capacity of the module, the derived additional dischargeable capacity of the second battery cell, the additional chargeable capacity of the second battery cell, and charge-discharge efficiency. Here, the charge-discharge efficiency may be defined as a value obtained by dividing a module discharge capacity by a module charge capacity.

Although some aspects of the invention have been described in the context of the apparatus, it may also represent a description according to a corresponding method, wherein a block or apparatus corresponds to a method step or feature of a method step. Similarly, aspects described in the context of a method may also represent a feature of a corresponding block or item or a corresponding apparatus. Some or all of the method steps may be performed by (or using) a hardware device, such as, for example, a microprocessor, a programmable computer, or an electronic circuit. In some embodiments, one or more of the most important method steps may be performed by such an apparatus.

In the forgoing, the present invention has been described with reference to the example embodiment of the present invention, but those skilled in the art may appreciate that the present invention may be variously corrected and changed within the range without departing from the spirit and the area of the present invention described in the appending claims.

The invention claimed is:

1. An apparatus for estimating a battery cell capacity, comprising:
    at least one processor; and
    a memory for storing at least one instruction executed by the at least one processor,
    wherein the at least one instruction includes:
        an instruction to derive a discharge curve for each battery cell included in a module including a plurality of battery cells including a first battery cell and a second battery cell;
        an instruction to derive a charge curve for each battery cell included in the module;
        an instruction to calculate an additional dischargeable capacity of the second battery cell based on a pattern of the discharge curve of the first battery cell;
        an instruction to calculate an additional chargeable capacity of the second battery cell based on a transition of the charge curve of the first battery cell;
        an instruction to calculate a remaining capacity of the second battery cell based on the additional dischargeable capacity and the additional chargeable capacity of the second battery cell; and
        an instruction to control charging or discharging of the plurality of the battery cells of the module based on the remaining capacity of the second battery cell.

2. The apparatus of claim 1, wherein the plurality of battery cells are connected in series and included in the module.

3. The apparatus of claim 1, wherein the first battery cell is a battery cell in which deterioration has progressed the most among the plurality of battery cells in the module.

4. The apparatus of claim 1, wherein the instruction to calculate an additional dischargeable capacity of the second battery cell includes an instruction to:
    extend the discharge curve of the second battery cell to a voltage at which the first battery cell is discharged to the maximum based on the pattern of the discharge curve of the first battery cell, wherein the extended part of the discharge curve of the second battery cell is derived by shifting the discharge curve of the first battery cell on a time axis.

5. The apparatus of claim 1, wherein the instruction to calculate an additional chargeable capacity of the second battery cell includes an instruction to:
    extend the charge curve of the second battery cell from a voltage at which the first battery cell is charged to the maximum based on the pattern of the charge curve of the first battery cell, wherein the extended part of the charge curve of the first battery cell is derived by shifting the charge curve of the first battery cell on a time axis.

6. The apparatus of claim 1, wherein the remaining capacity of the second battery cell is calculated based on a discharge capacity of the module, the additional dischargeable capacity of the second battery cell, the additional chargeable capacity of the second battery cell, and a charge-discharge efficiency.

7. The apparatus of claim 1, wherein the second battery cell is any one of the plurality of battery cells in the module other than the first battery cell.

8. A method for estimating a battery cell capacity, comprising:
    deriving a discharge curve for each battery cell included in a module including a plurality of battery cells including a first battery cell and a second battery cell;
    deriving a charge curve for each battery cell included in the module;
    calculating an additional dischargeable capacity of the second battery cell based on a pattern of the discharge curve of the first battery cell;
    calculating an additional chargeable capacity of the second battery cell based on a transition of the charge curve of the first battery cell;
    calculating a remaining capacity of the second battery cell based on the additional dischargeable capacity and the additional chargeable capacity of the second battery cell; and
    controlling charging or discharging of the plurality of the battery cells of the module based on the remaining capacity of the second battery cell.

9. The method of claim 8, wherein the plurality of battery cells are connected in series and included in the module.

10. The method of claim 8, wherein the first battery cell is a battery cell in which deterioration has progressed the most among the plurality of battery cells in the module.

11. The method of claim 8, wherein the calculating of the additional dischargeable capacity of the second battery cell includes:
    extending the discharge curve of the second battery cell to a voltage at which the first battery cell is discharged to the maximum based on the pattern of the discharge curve of the first battery cell, wherein the extended part of the discharge curve of the second battery cell is derived by shifting the discharge curve of the first battery cell on a time axis.

12. The method of claim 8, wherein the calculating of the additional chargeable capacity of the second battery cell includes:
    extending the charge curve of the second battery cell to a voltage at which the first battery cell is charged to the maximum based on the pattern of the charge curve of the first battery cell, wherein the extended part of the charge curve of the first battery cell is derived by shifting the charge curve of the first battery cell on a time axis.

13. The method of claim 8, wherein the calculating of the remaining capacity of the second battery cell includes:

calculating the remaining capacity of the second battery based on a discharge capacity of the module, the additional dischargeable capacity of the second battery cell, the additional chargeable capacity of the second battery cell, and a charge-discharge efficiency.

14. The method of claim 8, wherein the second battery cell is any one of the plurality of battery cells in the module other than the first battery cell.

* * * * *